US006646729B2

(12) United States Patent
van der Laan et al.

(10) Patent No.: US 6,646,729 B2
(45) Date of Patent: Nov. 11, 2003

(54) METHOD OF MEASURING ABERRATION IN AN OPTICAL IMAGING SYSTEM

(75) Inventors: Hans van der Laan, Veldhoven (NL); Marco H Moers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 240 days.

(21) Appl. No.: 09/788,478

(22) Filed: Feb. 21, 2001

(65) Prior Publication Data

US 2002/0008869 A1 Jan. 24, 2002

(30) Foreign Application Priority Data

Feb. 23, 2000 (EP) ............................................. 00301420

(51) Int. Cl.[7] ................................................ G01B 9/00
(52) U.S. Cl. ...................................................... 356/124
(58) Field of Search ........................ 356/124, 388–401; 382/141, 145, 151, 152, 181, 190, 207, 211, 286

(56) References Cited

U.S. PATENT DOCUMENTS

| | | | | | |
|---|---|---|---|---|---|
| 4,943,733 | A | * | 7/1990 | Mori et al. .................. | 250/548 |
| 5,666,206 | A | * | 9/1997 | Uchiyama .................... | 356/401 |
| 5,754,299 | A | * | 5/1998 | Sugaya et al. ............... | 356/401 |
| 5,821,014 | A | | 10/1998 | Chen et al. | |
| 5,828,455 | A | | 10/1998 | Smith et al. | |
| 6,078,380 | A | * | 6/2000 | Taniguchi et al. ............. | 355/52 |
| 6,356,345 | B1 | * | 3/2002 | McArthur et al. ........... | 356/121 |
| 6,360,012 | B1 | * | 3/2002 | Kreuzer ....................... | 382/211 |

FOREIGN PATENT DOCUMENTS

| | | |
|---|---|---|
| EP | 0 849 638 A2 | 6/1998 |
| TW | 357262 | 5/1999 |
| WO | WO00/31592 | 6/2000 |

OTHER PUBLICATIONS

Impact of Lens Aberrations on Optical Lithography, T.A. Brunner, IBM Hopewell Junction, New York, Conference San Diego, CA Oct. 27–29, 1996.
Novel Aberration Monitor for Optical Lithography, P. Dirksen et al., Part of the SPIE Conference on Optical Microlithography XII, Santa Clara, CA, Mar. 1999, SPIE vol. 3679, pp. 77–86.
A Practical Technology Path to Sub–0.10 Micron Process Generations via Enhanced Optical Lithography, J. Fung Cheng et al., ASML Mask Tools, Inc., 19th Annjual Symposium on Photomask Technology, Monterey, CA, Sep. 15–17, 1999.
0.35 $\mu$m Lithography Using Off–Axis Illumination, Paul Luehrmann et al., SPIE vol. 1927, pp. 103–124, Optical/Laser Microlighography VI (1993)/103.
Optical Proximity Correction for Intermediate–Pitch Features Using Sub–Resolution Scattering Bars, J. Fung Cheng et al., J. Vac. Sci. Technol. B 15(6), Nov./Dec. 1997, pp. 2426–2433.
Aberration Evaluation and Tolerancing of 193nm Lithographic Objective Lenses, Bruce W. Smith et al., SPIE vol. 3334/269, pp. 269–280, Optical Microlithography XI, Santa Clara, CA, Feb. 25–27, 1998.
Measurement of Lens Aberration Using an In–Situ Interferometer Reticle, Nigel Farrar et al., Advanced Reticle Symposium 1999, Optical Microlithography XIII, Santa Clara, CA, Mar. 1–3, 2000.

* cited by examiner

Primary Examiner—Michael P. Stafira
(74) Attorney, Agent, or Firm—Pillsbury Winthrop LLP

(57) ABSTRACT

A method of determining aberration of an optical imaging system comprises measuring at least one parameter, such as position of best-focus and/or lateral position, of an image formed by the imaging system. This is repeated for a plurality of different illumination settings of the imaging system, and from these measurements at least one coefficient, representative of aberration of said imaging system, is calculated.

17 Claims, 8 Drawing Sheets

Fig.2.

| Aberration | | Low Order Zernikes | | Higher Orders |
|---|---|---|---|---|
| m | Name | Function | Term | Term |
| 0 | Spherical | $6r^4 - 6r^2 + 1$ | Z9 | Z16, Z25, Z36, Z37 |
| 1 | X-Coma | $(3r^3 - 2r)\cos(\theta)$ | Z7 | Z14, Z23, Z34 |
| 1 | Y-Coma | $(3r^3 - 2r)\sin(\theta)$ | Z8 | Z15, Z24, Z35 |
| 2 | Astigmatism | $r^2 \cos(2\theta)$ | Z5 | Z12, Z21, Z32 |
| 2 | 45° Astigmatism | $r^2 \sin(2\theta)$ | Z6 | Z13, Z22, Z33 |
| 3 | X-Three Point Aberration | $r^3 \cos(3\theta)$ | Z10 | Z19, Z30 |
| 3 | Y-Three Point Aberration | $r^3 \sin(3\theta)$ | Z11 | Z20, Z31 |

Fig.3(a)

| NA | σ | $BF_{Z9=1nm}$ [nm] | $BF_{Z16=1nm}$ [nm] |
|---|---|---|---|
| 0.63 | 0.82-0.62 | -4.4 | -12.8 |
| 0.63 | 0.29-0.09 | -5.6 | -9.5 |
| 0.4 | 0.5-0.2 | -16.0 | 0.0 |
| 0.48 | 0.5-0.2 | -12.1 | -7.6 |
| 0.55 | 0.5-0.2 | -7.9 | -12.4 |
| 0.63 | 0.72-0.52 | 0.0 | -13.0 |

Fig.3(b)

| NA | σ | $BF_{Z9=1nm}$ [nm] | $BF_{Z16=1nm}$ [nm] |
|---|---|---|---|
| 0.7 | 0.58-0.88 | -1.7 | -8.5 |
| 0.7 | 0.11-0.32 | -4.8 | -6.2 |
| 0.5 | 0.2-0.5 | -11.8 | 0.0 |
| 0.55 | 0.2-0.5 | -9.5 | -4.1 |
| 0.6 | 0.2-0.5 | -6.7 | -7.4 |
| 0.7 | 0.42-0.72 | 0.0 | -9.0 |

| No. | NA | σ | $\Delta X_{Z7=1nm}$[nm] |
|---|---|---|---|
| 1 | 0.7 | 0.33-0.11 | 1.6 |
| 2 | 0.5 | 0.6-0.2 | 1.8 |
| 3 | 0.66 | 0.65-0.22 | 0.9 |
| 4 | 0.5 | 0.6-0.3 | 1.7 |
| 5 | 0.66 | 0.7-0.4 | 0.5 |
| 6 | 0.7 | 0.88-0.3 | -0.4 |
| 7 | 0.55 | 0.5-0.2 | 1.8 |
| 8 | 0.7 | 0.88-0.58 | -1.1 |

METHOD OF MEASURING ABERRATION IN AN OPTICAL IMAGING SYSTEM

BACKGROUND

1. Field of Invention

The present invention relates to a method of measuring aberration in an optical imaging system, such as a lithographic projection apparatus.

2. Discussion of Related Art

The patterning means here referred to should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatuses can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

There is a desire to integrate an ever-increasing number of electronic components in an IC. To realize this, it is necessary to increase the surface area of an IC and/or to decrease the size of the components. For the projection system, this means that both the image field and/or the resolution must be increased, so that increasingly smaller details, or line widths, can be imaged in a well-defined way in an increasingly large image field. This requires a projection system that must comply with very stringent quality requirements. Despite the great care with which such a projection system is designed and the very high accuracy with which the system is manufactured, such a system may still exhibit aberrations, such as spherical aberration, coma and astigmatism. In practice, the projection system ("lens") is thus not an ideal, diffraction-limited system, but an aberration-limited system. The aberrations are dependent on position in the image field and are an important source of variations in the imaged line widths occurring across the image field, as well as influencing the focus, exposure latitude and so on. They also cause field-dependent overlay errors between different mask structures and/or different illumination settings. The influence of aberrations becomes increasingly significant with the application of newer techniques, such as phase-shift masks or off-axis illumination, to enhance the resolving power of a lithographic projection apparatus.

A further problem is that the aberrations are not constant in modern lithographic projection systems. In order to minimise low-order aberrations, such as distortion, curvature of field, astigmatism, coma and spherical aberration, these projection systems generally comprise one or more movable elements. The wavelengths of the projection beam or the position of the mask table may be adjustable for the same purpose. When these adjusting facilities are used, other, smaller aberrations may be introduced. Moreover, since the intensity of the projection beam must be as large as possible, the components of the projection system are subject to ageing so that the aberrations may change during the lifetime of the apparatus. Moreover, reversible changes, e.g. as caused by lens heating, may temporarily change the aberrations.

Consequently there is a further problem of being able to measure the aberration reliably and accurately.

SUMMARY

It is an object of the present invention to provide an improved method and apparatus for determining aberration of the projection system.

Accordingly, the present invention provides a method of determining aberration of an optical imaging system comprising:

a radiation system for supplying a projection beam of radiation;

a support structure for supporting patterning means, the patterning means serving to pattern the projection beam according to a desired pattern;

a substrate table for holding a substrate; and a projection system for projecting the patterned beam onto a target portion of substrate. Observations are made as a function of parameters of the projection apparatus, and from these the presence of different types of aberration can be quantified. The method comprises the step of:

patterning the projection beam with said patterning means; and characterized by the steps of:

measuring at least one parameter of an image formed by the projection system, for a plurality of different settings of said radiation system and/or said projection system; and calculating at least one coefficient, representative of aberration of said imaging system, on the basis of said at least one parameter measured at said plurality of settings.

Preferably, said plurality of different settings comprise different numerical aperture settings and/or sigma settings, illumination modes or telecentricity modes; furthermore, one may use various types and sizes of test structures on, for instance, one or more masks, to create different diffraction effects in the projection system. All such variation should be interpreted as falling within the meaning of the phrase "different illumination settings" as used in this text. The term "sigma ($\sigma$) setting" refers to the radial extent of the intensity distribution in the beam at a pupil in the imaging system through which the radiation passes, normalized with respect to the maximum radius of the pupil. Thus, a sigma value of 1 represents an illumination intensity distribution with a radius at the pupil equal to the maximum radius of the pupil. The term "illumination mode" denotes the spatial distribution of the radiation at the pupil, which may be, for example, disc-shaped, annular (which would be characterized by sigma inner and sigma outer settings), quadrupolar, dipolar, soft-multipolar (including some radiation flux in between the poles), etc. The term "telecentricity modes" encompasses configuring the imaging system telecentrically and/or with varying degrees of non-telecentricity, for example by the use of prisms on top of a mask to tilt the illumination profile. These different settings can be selected conveniently in a lithographic projection apparatus.

The measured parameter can be one or more of: the position of best-focus of said image; the lateral position of said image; the deformation of said image; and other properties of exposing said image lithographically, such as line width and shape, and distance between adjacent structures.

Preferably, the plurality of different settings are selected such that the variation in the or each at least one measured parameter is substantially maximized. In this way the accuracy of the determined coefficient(s) can be improved.

Preferably, the plurality of different settings are selected such that the variation in said at least one measured parameter resulting from aberration represented by one or more of said coefficients is substantially zero, whilst the variation in said at least one parameter as the function of a coefficient that is to be determined, is non-zero. This technique enables different aberration coefficients, such as Zernike coefficients, to be obtained independently of each other.

The invention also provides a lithographic projection apparatus for projecting a patterned beam of radiation onto a substrate provided with a radiation-sensitive layer, the apparatus comprising:

a radiation system for providing a projection beam of radiation;

a support structure for supporting patterning means, the patterning means serving to pattern the projection beam according to a desired pattern;

a substrate table for holding a substrate;

a projection system for projecting the patterned beam onto a target portion of the substrate; and illumination setting means for providing a plurality of different illumination settings of said radiation system and/or said projection system;

characterized by further comprising:
    measuring means for measuring at least one parameter of a projected image formed by the projection system;
    control means for selecting a plurality of different illumination settings at which said measuring means takes measurements; and
    calculation means for calculating at least one coefficient, representative of aberration in said projection and/or radiation system, on the basis of said at least one parameter measured by said measuring means.

According to a further aspect of the invention there is provided a device manufacturing method comprising the steps of:

(a) providing a substrate that is at least partially covered by a layer of radiation sensitive material;

(b) providing a projection beam of radiation using a radiation system;

(c) using patterning means to endow the projection beam with a pattern in its cross-section;

(d) using a projection system to project the patterned beam of radiation onto a target portion of the layer of radiation-sensitive material, and characterized by the steps of:

measuring, prior to step (d), at least one parameter of an image formed by the projection system, for a plurality of different settings of said radiation system and/or said projection system;
    calculating at least one coefficient, representative of aberration of said projection and/or radiation system, on the basis of said at least one parameter measured at said plurality of settings;
    correcting for said aberration on the basis of said at least one calculated coefficient, to reduce aberration of an image projected by said projection system.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which:

FIG. 2 is a table summarizing the relationship between different low-order aberrations and their respective Zernike coefficients;

FIGS. 3(a) and 3(b) are tables of computed best-focus positions (with respect to an aberration-free scenario) at different illumination settings as a function of aberration due to Zernike coefficients Z9 and Z16;

FIGS. 6(a) and 6(b) represents the value of the aberration coefficient, in nm. The horizontal axes represent the x position along the slit, in mm;

In the Figures, corresponding reference symbols indicate corresponding parts.

DETAILED DESCRIPTION

First Embodiment

Figure 1:
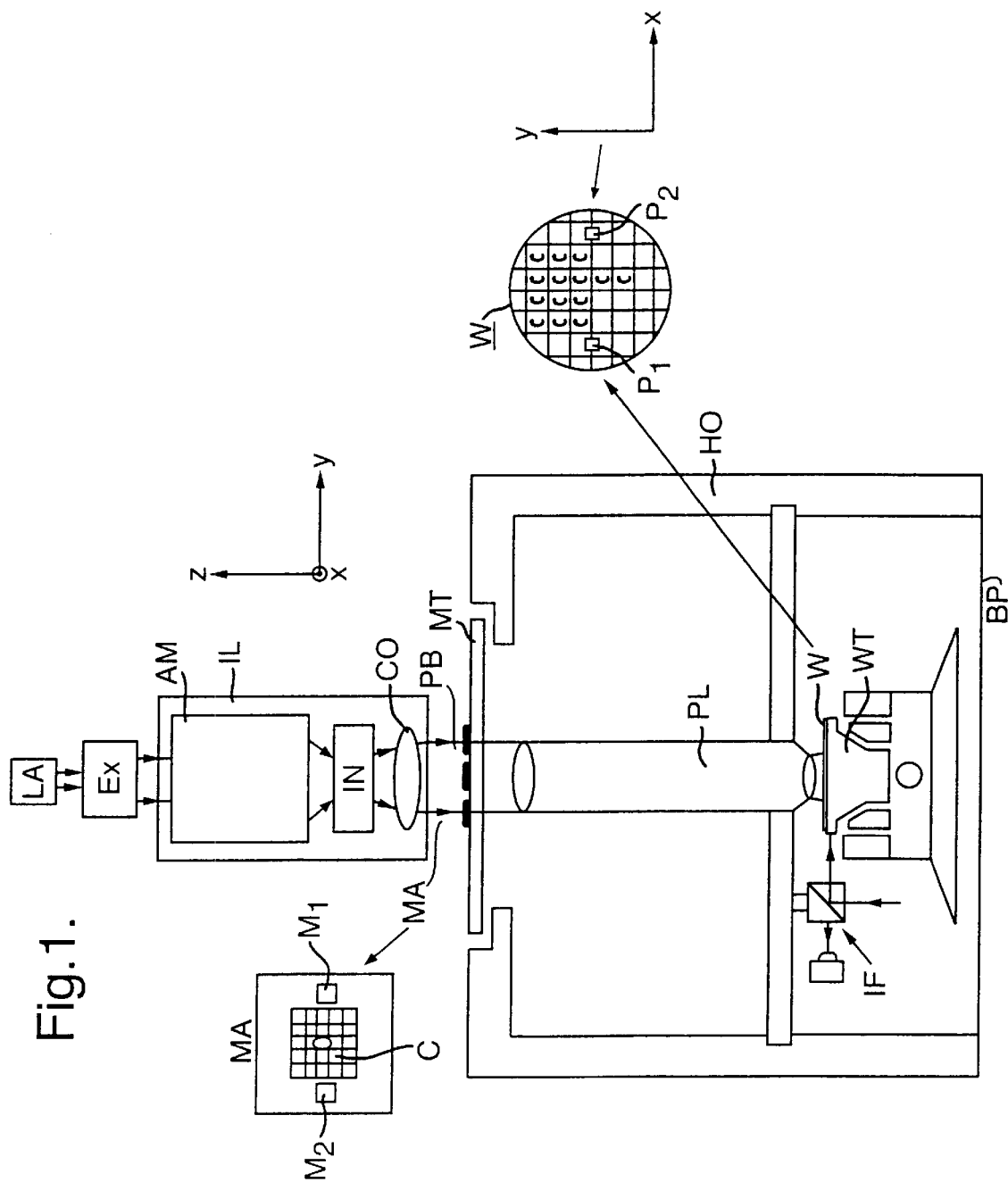
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. UV or EUV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive or catadioptric system or a mirror group) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a Hg lamp or an excimer laser) produces a beam of radiation. This beam is fed into an illumination system (illuminator) IL, either directly or after having traversed conditioning means, such as a beam expander Ex, for example. The illuminator IL may comprise adjusting means AM for setting the σ-outer and σ-inner values of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Aberrations of the projection lens in particular are considered in the embodiments of this invention. The projection lens wavefront aberrations can be written as a series according to their angular form:

$$W(r, \theta) = \sum_m R_m(r)\cos(m\theta) + R'_m(r)\sin(m\theta)$$

where r and θ are radial and angular co-ordinates, respectively, (r is normalized) and m is an index indicating the contribution of the mth aberration. R and R' are functions of r.

The aberration can also be expressed in terms of the Zernike expansion:

$$W = Z_i f_i(r, \theta) + Z_j f_j(r, \theta) + Z_k f_k(r, \theta) + \ldots$$

where each Z is the Zernike coefficient and each θ is the corresponding Zernike polynomial. The functions θ take the form of the product of a polynomial in r and in sin or cos of m 0. For example, the comatic aberration (m=1) can be represented by a Zernike series in Z7, Z8, Z14, Z15, Z23, Z24, Z34, Z35, etc., and, for example, the function associated with the Z7 coefficient [$f_7(r, \theta)$ in the notation above] is:

$$(3r^3 - 2r)\cos(\theta)$$

The Zernike expansion for the lower-order aberrations is summarized in the table given in FIG. 2.

One effect of spherical aberration is to shift the position of best focus in the z direction and this is used in the present embodiment to determine Z9 and Z16. Firstly, the theoretical shift in best-focus position is calculated using known computational techniques, such as the program known as "Solid C", a commercial software package supplied by the company Sigma-C GmbH in Germany, for simulating and modelling optical lithography. Other suitable software packages, such as one known as "Prolith", may alternatively be used. FIGS. 3(a) and 3(b) are tables giving the results of these calculations for two different lithographic projection apparatuses. The first two columns give the settings of the illumination mode in terms of the numerical aperture (NA), on the image side, and the sigma (θ) setting. The illumination modes used in the tables of FIGS. 3(a) and 3(b) are annular illumination modes, and the two values in the sigma column give the inner and outer radii of each annulus; the difference between the two values gives the width of the annulus as a fraction of the maximum radius of the pupil. Sometimes the sigma inner value is quoted followed by the sigma outer value, and sometimes vice versa; the order of the sigma values is not significant. The range of radial positions of the beam at the pupil is related to the range of angular incidence of the projection beam onto the substrate.

The third and fourth columns in FIGS. 3(a) and 3(b) give the calculated best-focus positions in nm relative to a particular datum. The third column is calculated assuming that the lens has an aberration corresponding to a Zernike coefficient Z9 of 1 nm, the other Zernike coefficients being zero. The fourth column is for the same situation but with aberration due to Zernike coefficient Z16 of 1 nm, all other Zernike coefficients being zero. The values in the third and fourth columns ($BF_{Z9=1nm}$ and $BF_{Z16=1\ nm}$) are effectively the gradients or partial differentials of the best-focus positions as a function of the respective Zernike coefficient, i.e.:

$$BF_{Z9=1nm}(NA, \sigma) = \frac{\partial BF}{\partial Z9}\bigg|_{all\ other\ coefficients\ constant}$$

in the approximation that 1 nm is a small change in Z9, with a corresponding relation for Z16.

The best-focus position is then measured using the actual lithographic projection apparatus at the same six different illumination settings as in each of the tables of FIG. 3. The best-focus position is the z-position with maximum contrast, e.g. defined by the maximum of a sixth-order polynomial fit to the contrast-versus-position curve as the position is moved from defocus, through focus and on to defocus. The best-focus can be determined experimentally using known techniques, such as the technique known as "FOCAL" (described below); alternatively, one may directly measure the aerial image, e.g. using a Transmission Image Sensor (TIS) (described below), or an overlay microscope or commercial focus monitor.

FOCAL is an acronym for OFcus Calibration by using ALignment. It is a best-focus measurement technique for completely determining information about the focal plane using the alignment system of the lithographic apparatus. A special, asymmetrically segmented alignment mark is imaged through focus on to a resist-coated wafer. The position of this imaged mark (latent or developed) can be measured by the said alignment system. Due to the asymmetric segmentation, the position measured by the alignment system will depend on the defocus used during exposure, thus allowing determination of the best-focus position. By distributing these marks over the whole image field and using different orientation for the segmentation, the complete focal plane for several structure orientations can be measured. This technique is described in more detail in U.S. Pat. No. 5,674,650, which is incorporated herein by reference.

One or more transmission image sensor(s) (TIS) can be used to determine the lateral position and best focus position (i.e. vertical and horizontal position) of the projected image, under the projection lens. A transmission image sensor (TIS) is inset into a physical reference surface associated with the substrate table (WT). In a particular embodiment, two sensors are mounted on a fiducial plate mounted to the top surface of the substrate table (WT), at diagonally opposite positions outside the area covered by the wafer W. The fiducial plate is made of a highly stable material with a very low coefficient of thermal expansion, e.g. Invar, and has a flat reflective upper surface that may carry markers used with another fiducial in alignment processes. The TIS is used to determine directly the vertical (and horizontal) position of the aerial image, as projected by the projection lens, of a TIS pattern on the mask. It comprises apertures in the reflective surface close behind which is placed a photodetector sensitive to the radiation used for the exposure process. To determine the position of the focal plane, the projection lens projects into space an image of a pattern provided on the mask MA and having contrasting light and dark regions. The substrate stage is then scanned horizontally (in one or preferably two directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the image of a TIS pattern has the greatest contrast and hence indicates the plane of optimum focus. The horizontal level at which the rate of change is highest indicates the aerial image's lateral position. An example of a TIS of this type is described in greater detail in U.S. Pat. No. 4,540,277. Advantages of TIS include robustness and speed because it is a direct measurement technique not involving exposure of a resist.

In cases where the present embodiment measures a parameter of the image (the best-focus position in this case) using the FOCAL technique at a plurality of different illumination settings, this will also be referred to by the acronym FAMIS, which stands for FOCAL At Multiple Illumination Settings.

The actual Zernike coefficients of the projection lens system can then be extracted using the following relation, which gives the first-order correction to the best-focus position resulting from aberration due to the particular Zernike coefficients of interest:

$$BF_{meas}(NA, \sigma) = a + b \cdot BF_{Z9=1\ nm}(NA, \sigma) + c \cdot BF_{Z16=1\ nm}(NA, \sigma)$$

where $BF_{meas}$ is the empirical best-focus position measured as a function of NA and $\sigma$.

The coefficients b and c are called the Zernike coefficients Z9 and Z16, respectively; the coefficient a is related to Z4, and can be regarded as substantially constant in the current context. Consequently, the relation can be rewritten as the following equation:

$$BF_{meas}(NA, \sigma) = const + Z9 \cdot BF_{Z9=1\ nm}(NA, \sigma) + Z16 \cdot BF_{Z16=1\ nm}(NA, \sigma)$$

This equation is an approximation which neglects higher-order corrections, cross-terms involving both Z9 and Z16, and so on, although these could be taken into account if necessary.

An equation, as above, is obtained for each illumination setting (NA and $\sigma$ values), six equations in total for the data in each of FIG. 3(a) or 3(b). From these six simultaneous equations, three unknowns (const, Z9, Z16) are to be extracted. As there are more equations than unknowns, the set of equations is over-determined. Multiple regression or a least-square fit can be used to determine the best values of the Zernike coefficients. In matrix notation, the simultaneous equations can be written as:

$$\begin{pmatrix} BF_{meas}(NA_1, \sigma_1) \\ BF_{meas}(NA_2, \sigma_2) \\ . \\ . \\ . \end{pmatrix} =$$

$$\begin{pmatrix} BF_{Z9=1nm}(NA_1, \sigma_1) & BF_{Z16=1nm}(NA_1, \sigma_1) & 1 \\ BF_{Z9=1nm}(NA_2, \sigma_2) & BF_{Z16=1nm}(NA_1, \sigma_1) & 1 \\ . & . & . \\ . & . & . \\ . & . & . \end{pmatrix} \cdot \begin{pmatrix} Z9 \\ Z16 \\ const \end{pmatrix}$$

The first two columns of the matrix are the third and fourth columns of the tables in FIG. 3(a) or 3(b) and are eigenvectors of the problem.

In a more compact notation this can be rewritten as:

$$BF_{meas} = \overline{\overline{BF}}_Z \cdot Z$$

so Zernike coefficients are extracted according to:

$$Z = \overline{\overline{BF}}_Z^{-1} \cdot BF_{meas}$$

Figure 4:
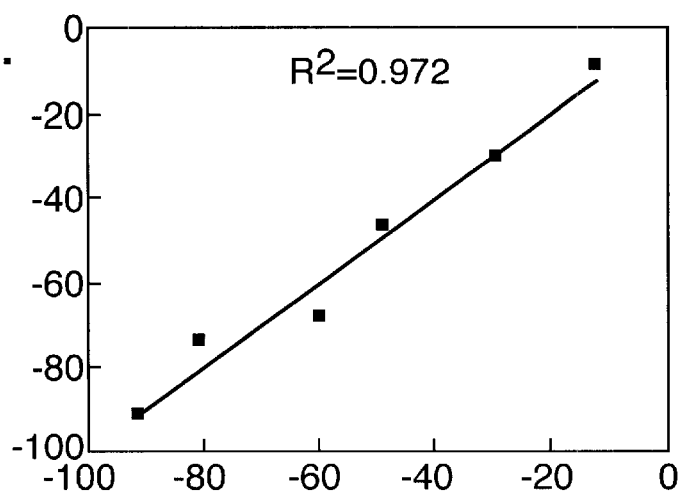
FIG. 4 is a plot showing the correlation between measured best-focus position and best-focus determined on the basis of Zernike aberration coefficients Z9 and Z16 measured according to the present invention, whereby each point in the plot corresponds to one of the illumination settings in FIG. 3. The measured best-focus position is plotted along the vertical axis, in nm; the calculated best-focus position is plotted along the horizontal axis, in nm.

The Zernike coefficients Z9 and Z16 can be extracted in this way. Not only their (absolute) values are of interest to the microlithographer, but also the effect they have on the best-focus position (and also on lateral shift or overlay error, particularly in the case of other Zernike coefficients such as will be described with reference to the second embodiment) such that appropriate corrections can be made to the imaging system at different illumination settings. FIG. 4 is a correlation plot between the actual measured best-focus position and the calculated best-focus position based on Z9 and Z16 determined according to the present embodiment of the invention. Each square represents a different illumination setting of the apparatus. As can be seen, there is excellent correlation, with the maximum focus deviation from the fitted line always less than 10 nm. The correlation coefficient $R^2=0.972$ ($R^2=0$ represents no correlation and $R^2=1$ represents perfect correlation).

Figure 5A:
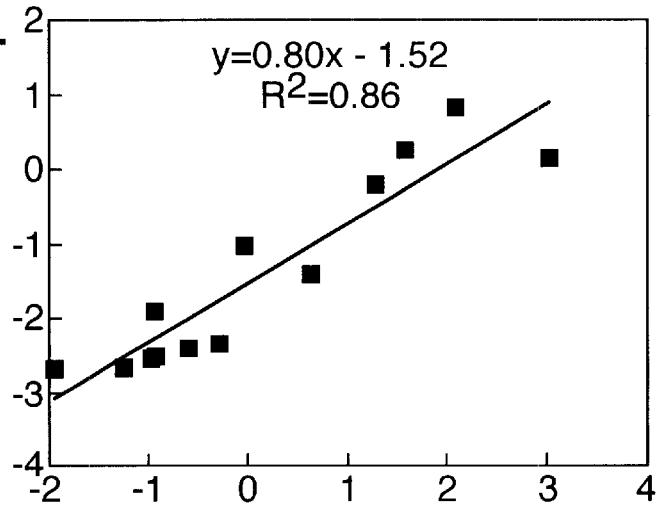
FIGS. 5(a) and 5(b) are graphs showing the correlation between a Zernike coefficient measured using the method according to the present invention (plotted along the vertical axis, in nm) and as determined using another method (plotted along the horizontal axis, in nm), for Z9 and Z16 respectively.
Figure 5B:
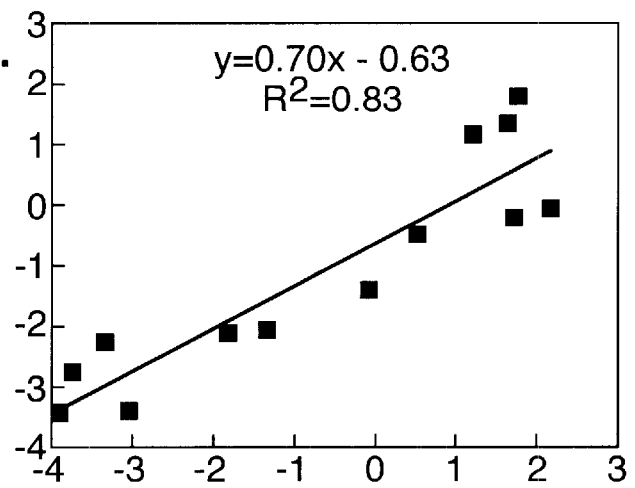

Further confirmation of the usefulness of the technique of the present invention is illustrated in FIGS. 5(a) and 5(b). These plot values of Z9 and Z16, respectively, as measured according to the present embodiment of the invention (FAMIS) against values of Z9 independently measured by the lens manufacturer using a technique referred to hereafter as SIF (Shearing InterFerometry). SIF is a through-the-lens (TTL) interferometric technique developed by the lens manufacturer. Each square represents measurements at a specific x position along the slit of the imaging system in a step-and-scan apparatus, and each graph shows a best-fit straight line. The correlation is again excellent, with correlation coefficients R of 0.86 and 0.83. The maximum deviation from the fit, which can be related to the precision of the measurement technique, is approximately 1 nm Zernike. This is well below the tolerance with which the lens system is manufactured. The technique of the present invention has the advantage that it can be performed with the imaging system in situ in a lithographic projection apparatus.

Figure 6A:
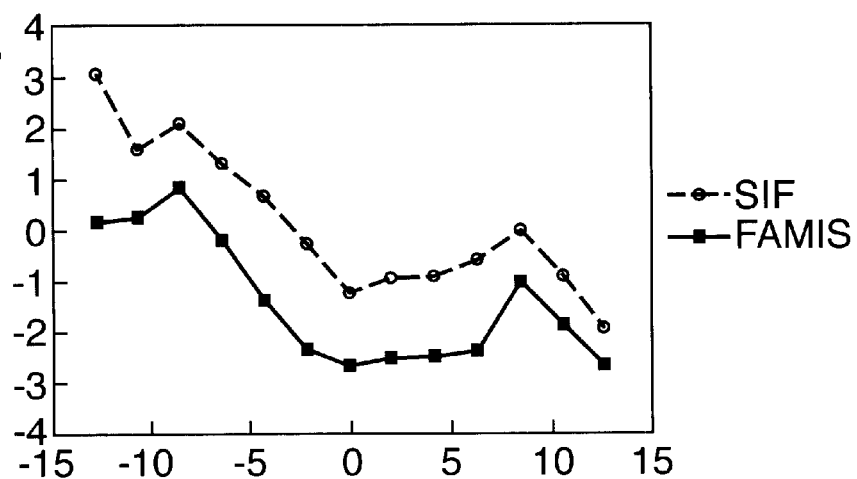
FIGS. 6(a) and 6(b) show plots of Zernike coefficients Z9 and Z16, respectively, as a function of x position along the slit of the projection system in a step-and-scan apparatus (in which the slit is scanned in the y-direction), as determined both by the method of the present invention and by another method. The vertical axis of both
Figure 6B:
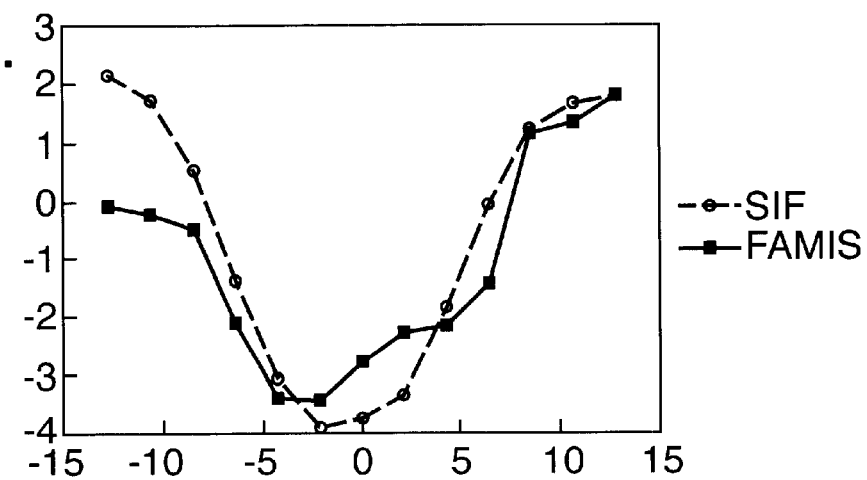

FIGS. 6(a) and 6(b) show plots of Zernike coefficients Z9 and Z16 measured as a function of position in the x-direction, i.e. perpendicular to the scan direction in an apparatus used in scan mode as described above. The aberration data were measured on a step-and-scan system, but used in step mode. The aberration data are plotted for each x-position (along the slit), but averaged along the scan direction (y-direction), so the coefficients represent integrated values of Z9 and Z16. Each graph shows a plot of the Zernike coefficient measured according to the present FAMIS technique and as measured independently by the SIF technique. The graph in FIG. 6(a) is a plot of the Z9 coefficient and the graph in FIG. 6(b) is a plot of the Z16 coefficient. These graphs again show the good correlation between the two measurement techniques. The correlation plots of FIGS. 5(a) and 5(b) correspond to the data in the graphs of FIGS. 6(a) and 6(b) respectively, with regard to said x-position.

Figure 7:
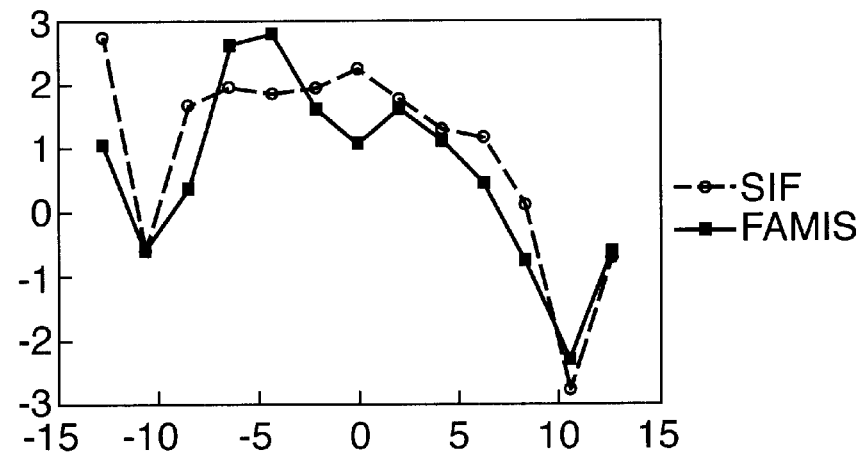
FIG. 7 is a graph of Z12 (shown along the vertical axis, in nm) as a function of x position along the slit of the projection system (shown along the horizontal axis, in mm) both as measured according to the method of the present invention and as measured using another method.

FIG. 7 shows results of measurements of the Z12 Zernike coefficient using the FAMIS technique of the present invention and using SIF. Z12 (which relates to the presence of astigmatism: see FIG. 2) can be calculated using the present invention in the same way as Z9 or Z16, that is by computing the variation in astigmatism values (difference in best-focus position between x- and y-oriented lines) for a fixed amount of aberration due to, for example, a Z12 coefficient of 1 nm. The actual astigmatism values are measured at the same illumination settings, and a series of simultaneous equations formed and solved for Z12.

The FAMIS technique of the first embodiment of this invention can be used for extracting Zernike coefficients corresponding to even aberrations (i.e. aberrations with m=0 or an even integer, see FIG. 2), such as spherical aberration as in FIGS. 3 to 6 and astigmatism as in FIG. 7, because these aberrations influence the position of best-focus. Odd aberrations will be discussed hereafter in the Second Embodiment.

Figure 8A:
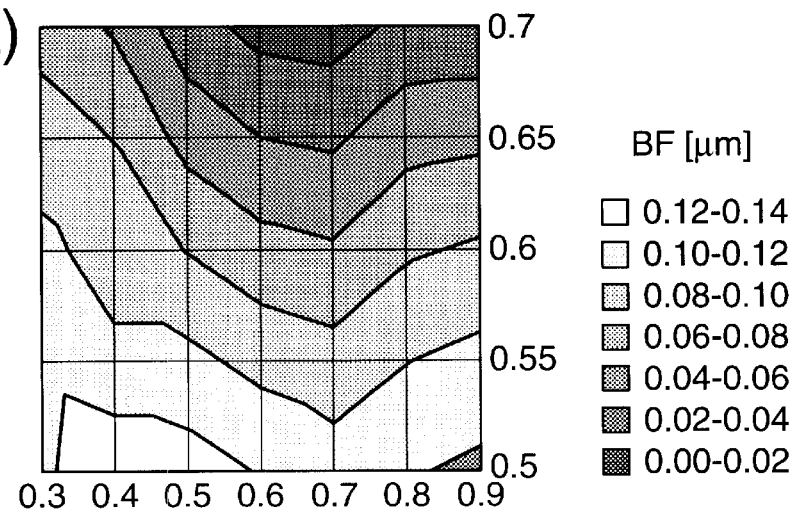
FIGS. 8(a) and 8(b) are contour plots of best-focus position as a function of the outer sigma setting (shown along the horizontal axes) and numerical aperture (shown along the vertical axes) of the projection system as a result of aberration due to non-zero Zernike coefficients Z9 and Z16, respectively.
Figure 8B:
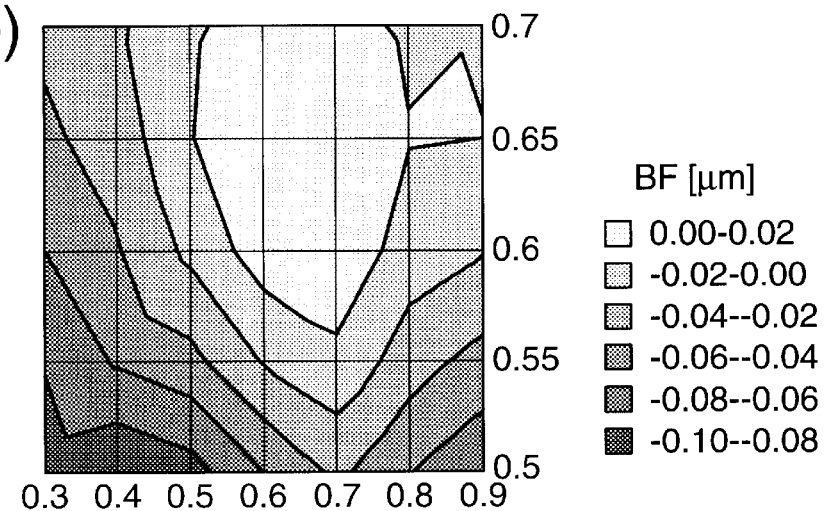

Further refinements can be adopted to increase the accuracy of the measurement. FIGS. 8(a) and 8(b) are contour plots mapping the calculated best-focus position BF (from simulations) as a function of the NA and outer sigma value of the illumination setting, as a result of aberration represented by Zernike coefficients Z9 and Z16 (respectively in FIGS. 8(a) and 8(b)). In each case the value of the respective Zernike coefficient was set at 10 nm. By choosing a range of different illumination settings that give rise to most change in best-focus position, the corresponding Zernike coefficient can be derived more accurately.

For example, in FIG. 8(a), if a series of measurements were taken with NA =0.5, but at different outer sigma settings, very little variation in best-focus position would be measured, and consequently Z9 could only be determined with relatively low accuracy. In contrast, a series of measurements at a fixed outer sigma setting of 0.7, but with NA ranging from 0.5 to 0.7, would yield a larger range in best-focus position and more accurate determination of Z9. One technique would be to take a series of measurements at a range of illumination settings that form a line substantially perpendicular to the contour lines in the plot of FIG. 8(a). The same considerations apply to determining Z16, and clearly from the contour plot in FIG.8(b), a range of different illumination settings would optimize the determination of Z16. To optimize the determination of both Z9 and Z16 simultaneously, the range of illumination settings should span variations in best-focus position as a function of both Z9 and Z16.

The technique according to the present invention can also be enhanced if it is desired to determine particular Zernike coefficients independently of each other. By taking measurements at a series of illumination settings which follow, for example, a contour line in the plot of FIG. 8(a), substantially no variation in best-focus position will be caused by Z9 aberration, and therefore substantially all the best-focus position variation will be due to the Z16 (or other) Zernike coefficients. In this way Z16 can be determined independently of Z9. The converse also applies, so that Z9 can be determined independently of Z16 by taking measurements at illumination settings corresponding to contour lines in FIG. 8(b).

Figure 9:
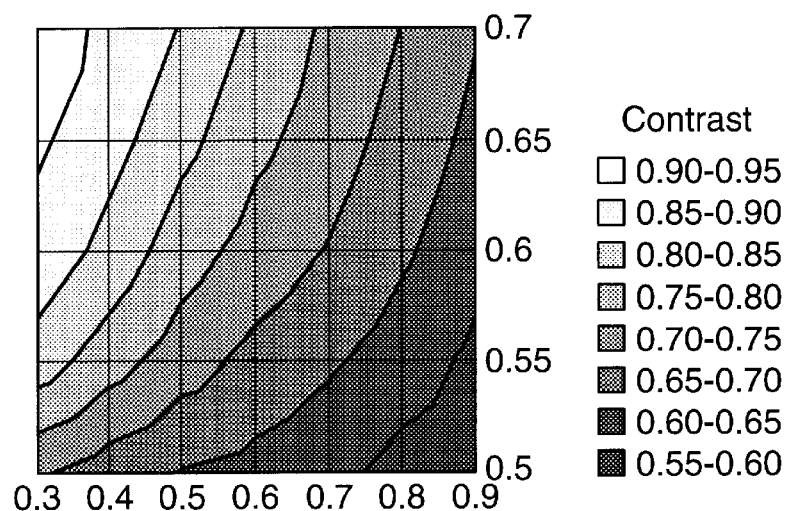
FIG. 9 is a contour plot of image contrast as a function of outer sigma setting (shown along the horizontal axis) and numeral aperture (shown along the vertical axis) of the projection system.

A further consideration in the present embodiment is that for the FOCAL technique to measure the best-focus position with most accuracy, the contrast should preferably be as high as possible. Contrast is mapped in FIG. 9 as a function of the NA and outer sigma values of the illumination settings. As can be seen in FIG. 9, contrast is maximized at high NA settings and low outer sigma settings.

The parameter being measured can also be maximized by optimizing the structure being imaged, for example the type and size of the structure e.g. isolated lines and dense lines, isolated spaces, contact holes and so on, and by the choice of mask type, for example binary masks, attenuated masks and alternating phase-shift masks.

Second Embodiment

The present invention can also be used to extract Zernike coefficients for odd aberrations. The present embodiment will be described in particular with reference to Zernike coefficient Z7, but could equally apply to other Zernike coefficients corresponding to aberrations with an odd value of m (see FIG. 2). Odd aberrations result in a lateral shift of the image.

Figures 10, 11:
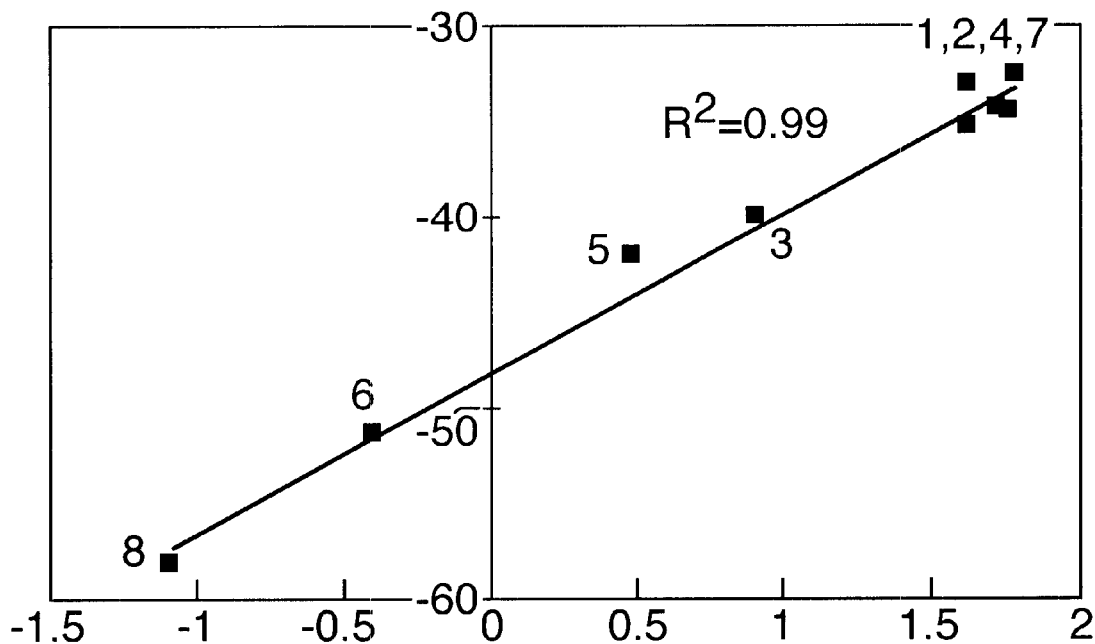
FIG. 10 is a table of calculated lateral shift in image position resulting from comatic (coma) aberration (non-zero Z7) as a function of illumination setting.
FIG. 11 is a graph showing correlation between measured x-shift (shown along the vertical axis, in nm) and calculated x-shift (shown along the horizontal axis, in nm) due to comatic aberration, whereby each point in the plot corresponds to one of the illumination settings in FIG. 10.

FIG. 10 is a table of computed lateral shift in the x-direction (also called x-shift, dX or ΔX) at eight different annular illumination settings; the settings of NA and sigma are given just as in FIG. 3. The dX values are calculated on the basis of aberration due to a Zernike coefficient Z7 of 1 nm.

Further calculations can give corresponding shifts due to the next-highest-order Zernike coefficient that results in x-shift, namely Z14 (see FIG. 2).

The lateral shift in image position can be measured in an actual lithographic projection apparatus using a distortion-measuring technique hereinafter referred to as "DISTO" (described below); alternatively, one may directly measure the position of an aerial image, e.g. using a Transmission Image Sensor (TIS) (described above) or other technique mentioned in connection with the first embodiment.

DISTO is a technique for finding the lateral positional errors of the image plane (x,y plane). A standard alignment mark, consisting of horizontal and vertical equal lines/spaces (e.g. line width 8 μm for the imaged mark), is imaged on to a resist-coated wafer. The position of this imaged mark (latent or developed) can be measured by the alignment system of the lithographic apparatus. The deviation with respect to the expected position is the distortion. By distributing these marks over the whole image field, the complete image field distortion can be measured.

Where the second embodiment of this invention uses the DISTO technique at multiple illumination settings, this will be referred to as "DAMIS", an acronym for DISTO At Multiple Illumination Settings.

The values of Z7 and Z14 can then be determined from the following relation, which gives the first-order correction to the measured shift in x-position resulting from X-coma due to non-zero Zernike coefficients Z7 and Z14:

$$dX_{meas}(NA, \sigma) = a + b \cdot dX_{Z7=1\ nm}(NA, \sigma) + c \cdot dX_{Z14=1\ nm}(NA, \sigma)$$

The constants b and c in this case are now the Zernike coefficients Z7 and Z14, respectively, and can be obtained using the same matrix manipulation and multiple regression or least-square fitting as explained above in the first embodiment with reference to Z9 and Z16. In this case, term a is related to Z2, and is substantially constant.

FIG. 11 shows a plot of correlation between experimentally measured X-shift (plotted along the vertical axis, in nm) and the calculated shift caused by a Zernike coefficient Z7 of 1 nm (plotted along the horizontal axis, in nm). The plotted points and calculated shifts correspond to the illumination settings in the table of FIG. 10. The gradient of the line of best-fit gives the extracted value of Z7 for this apparatus, which in this particular example gives Z7 approximately equal to 7 nm.

Figure 12A:
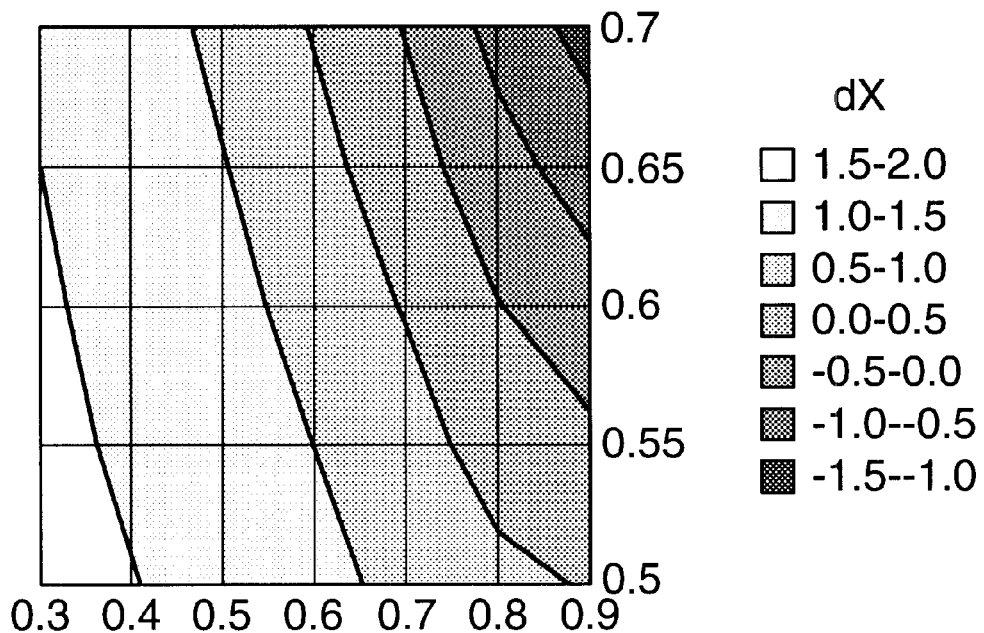
FIGS. 12(a) and 12(b) are contour plots of x-shift due to non-zero Zernike coefficients Z7 and Z14, respectively, as a function of outer sigma setting (shown along the horizontal axes) and numerical aperture (shown along the vertical axes) of the imaging system.
Figure 12B:
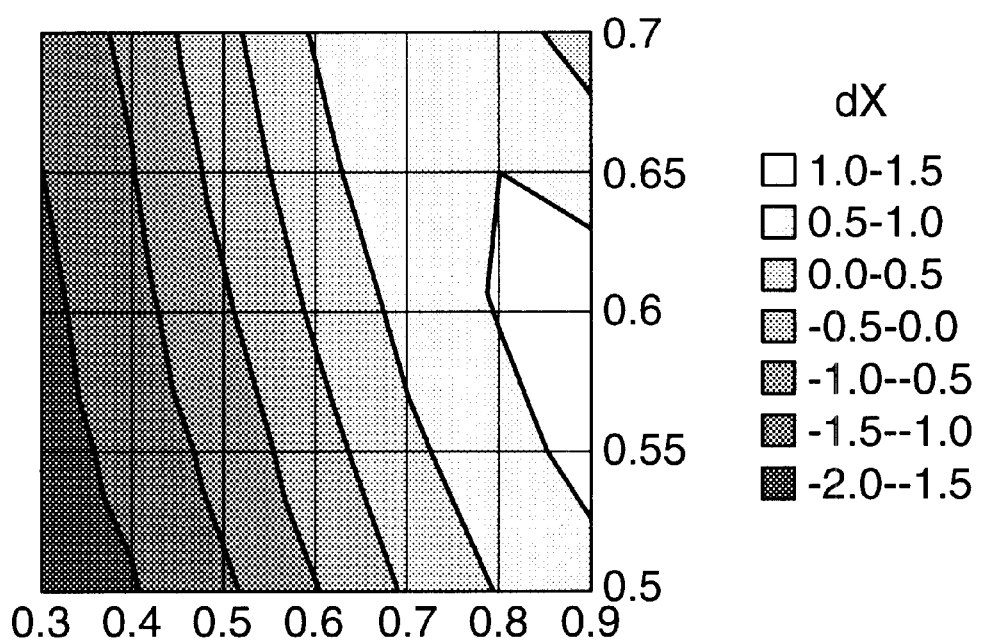

FIGS. 12(a) and 12(b) show contour plots that map the shift dX in x-position in the illumination mode plane analogously to FIGS. 8(a) and 8(b). Here, the illumination setting was annular, with a ring width (sigma-outer)−(sigma-inner) =0.3. Again, by appropriate choice of illumination settings at which to take measurement, the accuracy of determination of Z7 or Z14, respectively, can be improved, or variation due to one or other of Z7 and Z14 can be reduced or eliminated to separate its contribution to the aberration from that of the other coefficient, as explained above for Z9 and Z16 with respect to FIG. 8.

Figure 13A:
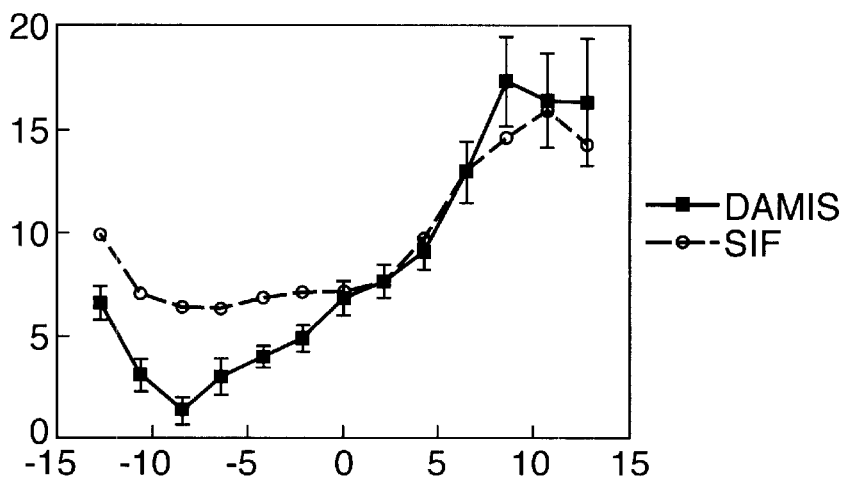
FIGS. 13(a) and 13(b) are plots of Zernike coma coefficients Z7 and Z8 (shown along the vertical axes, in nm), respectively, as functions of x position along the slit of the imaging system (shown along the horizontal axes, in mm), both as measured according to the method of the present invention and as measured using another method.
Figure 13B:
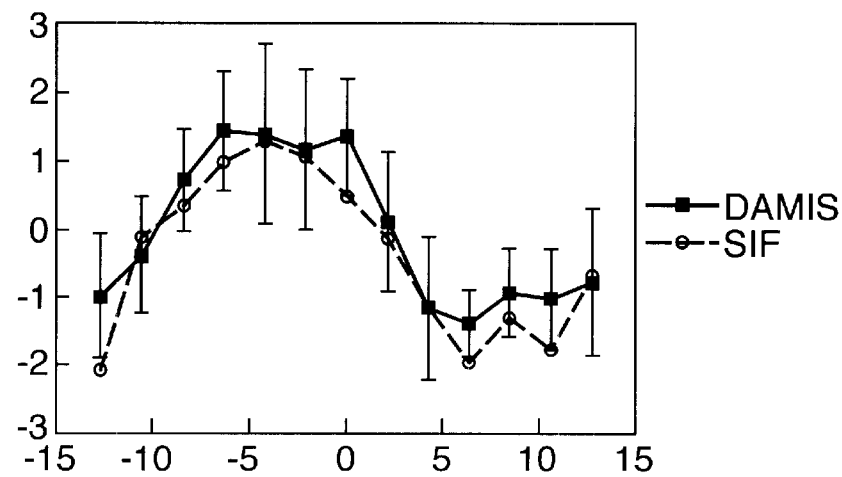

FIGS. 13(a) and 13(b) give further proof of the technique of the second embodiment of the invention. These Figures show plots of Z7 (X-coma) and Z8 (Y-coma) as a function of x-position along the exposure slit. Values of the respective Zernike coefficients are plotted as obtained by the present invention and as independently measured using SIF. The correlation is again good.

Figure 14:
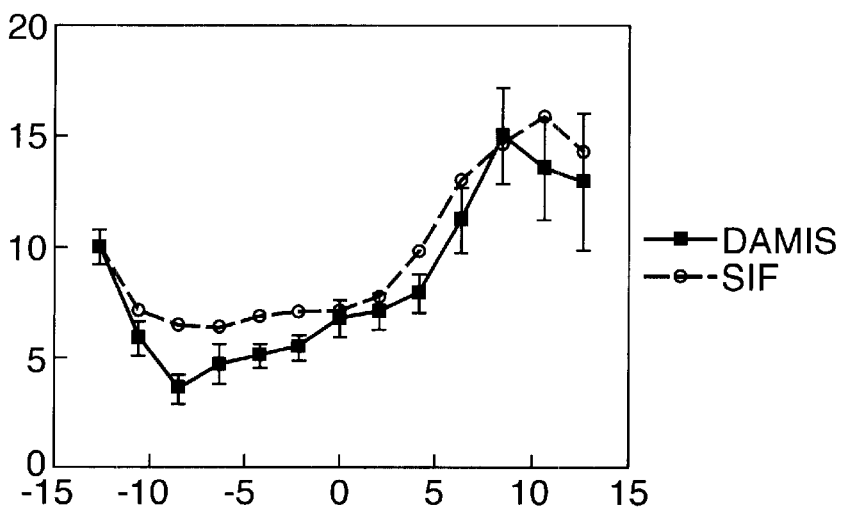
FIG. 14 is a plot corresponding to that of FIG. 13(a), but with a wavelength correction applied to the data of the present invention.

The discrepancy between the values in FIG. 13(a) can largely be reconciled by a tilt correction giving a variation in Z7 with x-position along the slit. FIG. 14 plots the same data as FIG. 13(a), but with the DAMIS measurements of Z7 corrected by 0.39 nm per mm in x-position along the slit. This correction is achieved by an appropriately chosen wavelength shift. By way of illustration of the utility of the present invention, the total comatic aberration in the projection system indicated by the value of Z7 in FIG. 13(a), measured according to the invention, could be corrected by a (slightly longer) wavelength shift.

Although, in the embodiments described above, the sequence of operations consisted of calculating the expected shift in best-focus position or in x- or y-position using a simulation for different illumination settings, followed by measuring the actual shifts at those illumination settings, it may of course be more practical to take the measurements first at particular illumination settings and then to calculate the appropriate quantities using the simulation at the actual illumination settings at which measurements were taken. Preferably, a sequence of test exposures is made sequentially, each with different NA and sigma settings, but with all other parameters of the exposures unchanged.

To correct for the effects of machine drift, the measurement using the first illumination setting can be repeated at the end, and possibly also once or more often between the intervening different illumination settings, of a given measurement sequence.

When making test exposures on wafers, it is advantageous to employ a technique known as "micro-stepping" or "die-in-die" exposures, because the same part of the wafer is used for all illumination settings, so all exposures are subject to substantially identical resist processing and metrology errors, and therefore the reproducibility of the test is increased.

The embodiments above have described lens aberration in terms of Zernike polynomials, but this is merely one of many possible sets of functions which can be used to describe wavefront aberrations, and the present invention can be used to measure aberrations in terms of parameters other than Zernike coefficients.

Whilst specific embodiments of the invention have been described above, it will be appreciated that the invention may be practised otherwise than as described. The description is not intended to limit the invention. In particular it will be appreciated that the invention may be used for the projection system of a lithographic apparatus and in any other type of imaging system in which aberrations are to be measured independently of each other, reliably and accurately.

We claim:

1. A method of determining aberration of an optical imaging system, comprising:
   a radiation system constructed and arranged to supply a projection beam of radiation;
   a support structure constructed and arranged to support a patterning device, the patterning device serving to pattern the projection beam according to a desired pattern;
   a substrate table constructed and arranged to hold a substrate; and
   a projection system constructed and arranged to project the patterned beam onto a target portion of the substrate; the method comprising:
      patterning the projection beam with said patterning device;
      measuring at least one parameter of an image formed by the projection system, for a plurality of different illumination settings of said radiation system and/or for a plurality of different numerical aperture settings of said projection system; and
   calculating at least one coefficient, representative of aberration of said imaging system, on the basis of said at least one parameter measured at said plurality of settings.

2. A method according to claim 1, wherein said plurality of different illumination settings comprise different settings of pupil filling at a pupil plane in the imaging system.

3. A method according to claim 1, wherein said plurality of different illumination settings comprise different illumination modes selected from the group comprising disc-shaped, annular, quadrupolar, dipolar and soft-multipolar illumination modes.

4. A method according to claim 1, wherein said plurality of different illumination settings comprises telecentric and non-telecentric illumination settings, or a plurality of non-telecentric illumination settings.

5. A method according to claim 1, wherein said at least one parameter is the position of best focus of said image.

6. A method according to claim 1, wherein said at least one parameter is the lateral position of said image.

7. A method according to claim 1, wherein said plurality of different illumination settings of said radiation system and/or said plurality of different numerical aperture settings of said projection system are selected such that the variation in at least one measured parameter is substantially maximized.

8. A method of determining aberration of an optical imaging system, comprising:
   a radiation system constructed and arranged to supply a projection beam of radiation;
   a support structure constructed and arranged to support a patterning device, the patterning device serving to pattern the projection beam according to a desired pattern;
   a substrate table constructed and arranged to hold a substrate; and
   a projection system constructed and arranged to project the patterned beam onto a target portion of the substrate; the method comprising:
      patterning the projection beam with said patterning device;
      measuring at least one parameter of an image formed by the projection system, for a plurality of different settings of said radiation system and/or said projection system; and
      calculating at least one coefficient, representative of aberration of said imaging system, on the basis of said at least one parameter measured at said plurality of settings,
      wherein said plurality of different illumination settings of said radiation system and/or of different numerical aperture settings of said projection system are selected such that the variation in said at least one measured parameter resulting from aberration represented by one or more of said coefficients is substantially zero, while the variation in said at least one parameter as a function of a desired coefficient is non-zero.

9. A method of determining aberration of an optical imaging system, comprising:
   a radiation system constructed and arranged to supply a projection beam of radiation;
   a support structure constructed and arranged to support a patterning device, the patterning device serving to pattern the projection beam according to a desired pattern;
   a substrate table constructed and arranged to hold a substrate; and
   a projection system constructed and arranged to project the patterned beam onto a target portion of the substrate; the method comprising:
      patterning the projection beam with said patterning device;
      measuring at least one parameter of an image formed by the projection system, for a plurality of different settings of said radiation system and/or said projection system;
      calculating at least one coefficient, representative of aberration of said imaging system, on the basis of said at least one parameter measured at said plurality of settings; and
      calculating a theoretical variation, for each of said plurality of different illumination settings, of said at least one measured parameter as a function of a small change in said at least one coefficient.

10. A method of determining aberration of an optical imaging system, comprising:
    a radiation system constructed and arranged to supply a projection beam of radiation;
    a support structure constructed and arranged to support a patterning device, the patterning device serving to pattern the projection beam according to a desired pattern;
    a substrate table constructed and arranged to hold a substrate; and
    a projection system constructed and arranged to project the patterned beam onto a target portion of the substrate; the method comprising:
       patterning the projection beam with said patterning device;

measuring at least one parameter of an image formed by the projection system, for a plurality of different settings of said radiation system and/or said projection system; and calculating at least one coefficient, representative of aberration of said imaging system, on the basis of said at least one parameter measured at said plurality of settings, wherein said at least one coefficient is calculated by multiple regression or a least-square fit of a set of simultaneous equations.

11. A method of determining aberration of an optical imaging system, comprising:

a radiation system constructed and arranged to supply a projection beam of radiation;

a support structure constructed and arranged to support a patterning device, the patterning device serving to pattern the projection beam according to a desired pattern;

a substrate table constructed and arranged to hold a substrate; and a projection system constructed and arranged to project the patterned beam onto a target portion of the substrate; the method comprising:

patterning the projection beam with said patterning device;

measuring at least one parameter of an image formed by the projection system, for a plurality of different settings of said radiation system and/or said projection system; and calculating at least one coefficient, representative of aberration of said imaging system, on the basis of said at least one parameter measured at said plurality of settings, wherein said at least one coefficient is a Zernike coefficient.

12. A lithographic projection apparatus for projecting a patterned beam of radiation onto a substrate provided with a radiation-sensitive layer, the apparatus comprising:

a radiation system constructed and arranged to provide a projection beam of radiation;

a support structure constructed and arranged to support a patterning device, the patterning device serving to pattern the projection beam according to a desired pattern;

a substrate table constructed and arranged to hold a substrate;

a projection system constructed and arranged to project the patterned beam onto a target portion of the substrate;

an illumination setter constructed and arranged to provide a plurality of different illumination settings of said radiation system and/or a plurality of different numerical aperture settings of said projection system, comprising:

a measuring device constructed and arranged to measure at least one parameter of a projected image formed by the projection system;

a controller constructed and arranged to select a plurality of different illumination settings and/or a plurality of different numerical aperture settings at which said measuring device takes measurements; and a calculator constructed and arranged to calculate at least one coefficient, representative of aberration of said projection and/or radiation system, on a basis of said at least one parameter measured by said measuring device.

13. An apparatus according to claim 12, wherein the support structure comprises a mask table constructed and arranged to hold a mask.

14. An apparatus according to claim 12, wherein the radiation system comprises a radiation source.

15. A method of manufacturing a device using a lithographic projection apparatus, comprising:

(a) providing a substrate that is at least partially covered by a layer of radiation-sensitive material;

(b) providing a projection beam of radiation using a radiation system;

(c) using a patterning device to endow the projection beam with a pattern in its cross-section;

(d) using a projection system to project the patterned beam of radiation onto a target portion of the layer of radiation-sensitive material;

measuring, prior to (d), at least one parameter of an image formed by the projection system, for a plurality of different illumination settings of said radiation system and/or for a plurality of different numerical aperture settings of said projection system;

calculating at least one coefficient, representative of aberration of said projection and/or radiation system, on a basis of said at least one parameter measured at said plurality of different illumination settings of said radiation system and/or said plurality of different numerical aperture settings of said projection system;

correcting for said aberration on the basis of said at least one calculated coefficient, to reduce aberration of an image projected by said projection system.

16. A method according to claim 15, wherein said correcting comprises correcting for changes in lateral and/or best-focus position of said image when changing between different illumination settings.

17. A device manufactured according to the method of claim 15.

* * * * *